(12) United States Patent
Morita et al.

(10) Patent No.: US 12,467,689 B2
(45) Date of Patent: Nov. 11, 2025

(54) FURNACE OPENING STRUCTURE, SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Shinya Morita, Toyama (JP); Seiyo Nakashima, Toyama (JP); Yoshitaka Abe, Toyama (JP); Kazuhiro Harada, Toyama (JP); Yasunobu Koshi, Toyama (JP); Shingo Nohara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 740 days.

(21) Appl. No.: 17/885,076

(22) Filed: Aug. 10, 2022

(65) Prior Publication Data

US 2023/0089509 A1    Mar. 23, 2023

(30) Foreign Application Priority Data

Sep. 21, 2021    (JP) .................................. 2021-153668

(51) Int. Cl.
*F27B 17/00* (2006.01)
*H01L 21/67* (2006.01)

(52) U.S. Cl.
CPC .... *F27B 17/0025* (2013.01); *H01L 21/67098* (2013.01); *H01L 21/67248* (2013.01)

(58) Field of Classification Search
CPC ........... F27B 17/0025; H01L 21/67098; H01L 21/67115; H01L 21/67248; H01L 21/67303

(Continued)

(56) References Cited

U.S. PATENT DOCUMENTS 10,351,951 B2    7/2019    Yamazaki et al.
2002/0168854 A1  11/2002   Tometsuka
(Continued)

FOREIGN PATENT DOCUMENTS

CN    112563159 A    3/2021
JP    2002-334868 A    11/2002
(Continued)

OTHER PUBLICATIONS

State Intellectual Property Office of China Office Action Issued on Oct. 31, 2024 for Chinese Patent Application No. 202210870323.0.
(Continued)

*Primary Examiner* — Sang Y Paik
(74) *Attorney, Agent, or Firm* — Volpe Koenig

(57) ABSTRACT

There is provided a technique capable of capable of preventing a substrate from being metal-contaminated by a component constituting a furnace opening. According to one aspect thereof, there is provided a furnace opening structure including: an upper inlet structure connected to a first protrusion provided at a lower portion of a reaction tube via a first seal, and configured to support the reaction tube; a lower inlet structure connected to the upper inlet structure via a second seal; and a fixing structure connected to the upper inlet structure and configured to fix the first protrusion, wherein the upper inlet structure is provided below an exhaust pipe provided at the lower portion of the reaction tube, and wherein the first protrusion is configured to be capable of being cooled by circulating a cooling medium through flow paths provided inside the upper inlet structure and the fixing structure, respectively.

20 Claims, 7 Drawing Sheets

(58) Field of Classification Search
USPC .......................................................... 219/413
See application file for complete search history.

(56) References Cited

U.S. PATENT DOCUMENTS

| | | | |
|---|---|---|---|
| 2003/0175426 A1* | 9/2003 | Shiratori | ............. C23C 16/4401 |
| | | | 118/724 |
| 2017/0335452 A1* | 11/2017 | Yamazaki | ............. C23C 16/455 |
| 2021/0087678 A1 | 3/2021 | Ebata et al. | |
| 2021/0348275 A1* | 11/2021 | Kurata | ............. C23C 16/45563 |

FOREIGN PATENT DOCUMENTS

| | | | |
|---|---|---|---|
| JP | 2007-266337 A | 10/2007 |
| JP | 2021-052092 A | 4/2021 |
| KR | 1020170097749 A | 8/2017 |
| KR | 1020210036282 A | 4/2021 |
| WO | 2016/125626 A1 | 8/2016 |

OTHER PUBLICATIONS

Korean Office Action issued on Dec. 12, 2024 for Korean Patent Application No. 10-2022-0099274.
Japanese Office Action issued on Mar. 9, 2023 for Japanese Patent Application No. 2021-153668.

* cited by examiner

FURNACE OPENING STRUCTURE, SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2021-153668, filed on Sep. 21, 2021, in the Japanese Patent Office, the entire contents of which are hereby incorporated by reference.

BACKGROUND

1. Field

The present disclosure relates to a furnace opening structure, a substrate processing apparatus and a method of manufacturing semiconductor device.

2. Related Art

As a part of a manufacturing process of a semiconductor device, a process of forming a film on a substrate may be performed. In such a case, particles may be generated or a metal contamination may be caused by a component constituting a furnace opening.

SUMMARY

According to the present disclosure, there is provided a technique capable of preventing a substrate from being metal-contaminated by a component constituting a furnace opening.

According to one aspect of the technique of the present disclosure, there is provided a furnace opening structure including: an upper inlet structure connected to a first protrusion provided at a lower portion of a reaction tube via a first seal, and configured to support the reaction tube; a lower inlet structure connected to the upper inlet structure via a second seal; and a fixing structure connected to the upper inlet structure and configured to fix the first protrusion, wherein the upper inlet structure is provided below an exhaust pipe provided at the lower portion of the reaction tube, and wherein the first protrusion is configured to be capable of being cooled by circulating a cooling medium through flow paths provided inside the upper inlet structure and the fixing structure, respectively.

DETAILED DESCRIPTION

Embodiments of Present Disclosure

Figure 1:
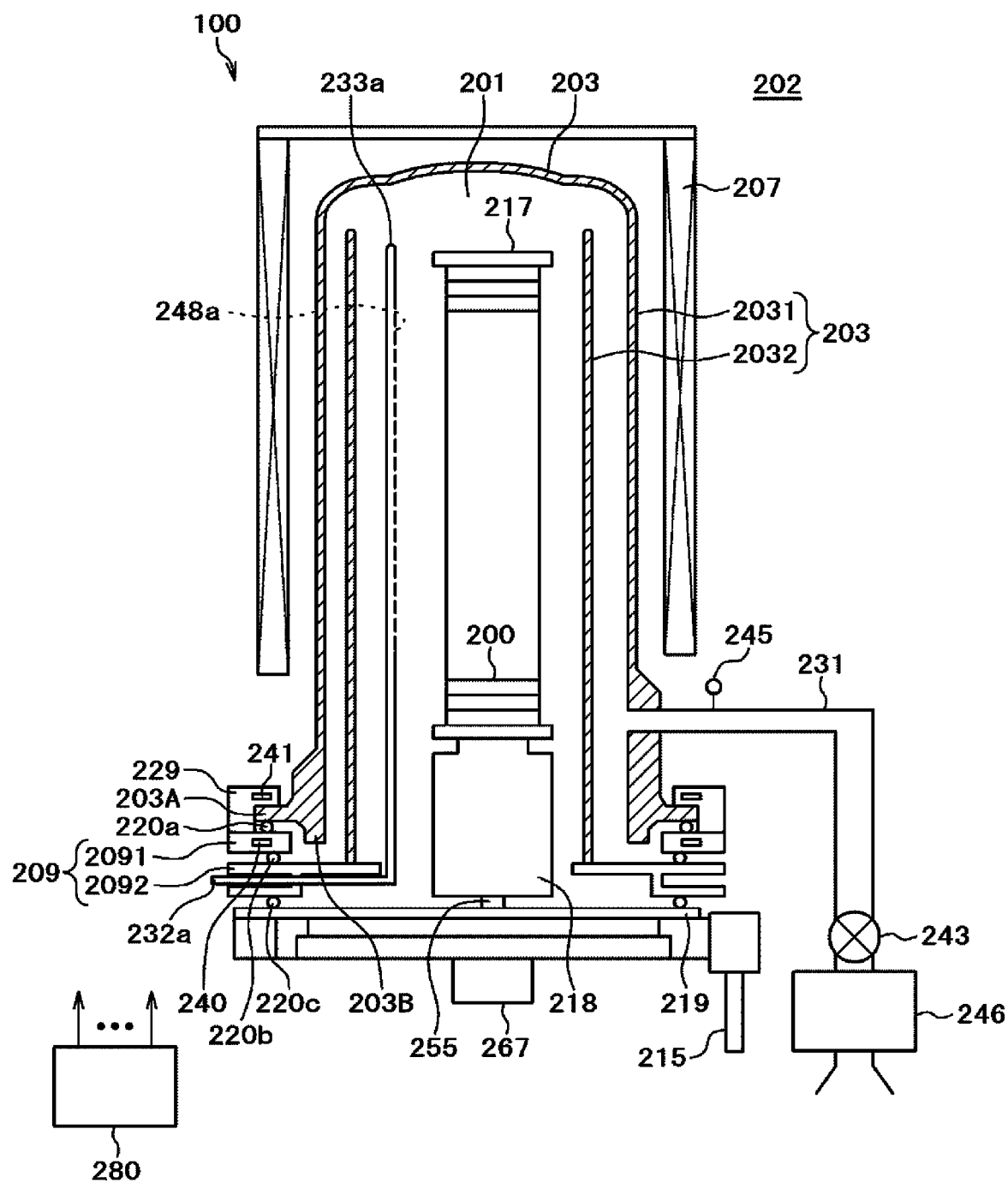
FIG. 1 is a diagram schematically illustrating a configuration of a substrate processing apparatus preferably used in one or more embodiments of the present disclosure.

Hereinafter, one or more embodiments (also simply referred to as "embodiments") according to the technique of the present disclosure will be described mainly with reference to FIGS. 1 through 5. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

As shown in FIG. 1, a substrate processing apparatus 100 according to the present embodiments includes a process furnace 202. The process furnace 202 includes a heater 207 serving as a heating structure (which is a heating apparatus). The heater 207 is of a cylindrical shape, and is vertically installed while being supported by a heater base (not shown) serving as a support plate.

A reaction tube 203 is provided in an inner side of the heater 207 to be aligned in a manner concentric with the heater 207. The reaction tube 203 is constituted by an outer tube (also referred to as an "outer reaction tube") 2031 and an inner tube (also referred to as an "inner reaction tube") 2032 provided in an inner side of the outer tube 2031. For example, the reaction tube 203 (that is, the outer tube 2031 and the inner tube 2032) is made of a heat resistant material such as quartz ($SiO_2$) and silicon carbide (SiC). The outer tube 2031 is of a cylindrical shape with a closed upper end and an open lower end. The outer tube 2031 is provided outside of the inner tube 2032 so as to surround the inner tube 2032. A protrusion (also referred to as a "first protrusion" or a "flange") 203A that protrudes around an entirety of an outer periphery of the outer tube 2031 and an extension (also referred to as a "second protrusion") 203B that extends downward from the protrusion 203A are provided at a lower portion (that is, the lower end) of the outer tube 2031. The extension 203B may also be referred to as a protrusion 203B. The inner tube 2032 is of a cylindrical shape with open upper and lower ends. A process chamber 201 is provided in a hollow cylindrical portion of the inner tube 2032. The process chamber 201 is configured such that a plurality of wafers including a wafer 200 serving as a substrate are capable of being accommodated in the process chamber 201 and arranged in a horizontal orientation in a multistage manner along a vertical direction by a boat 217 serving as a substrate retainer described later. Hereinafter, the plurality of wafers including the wafer 200 may also be simply referred to as wafers 200.

An exhaust pipe 231 through which an inner atmosphere of the process chamber 201 is exhausted is provided at a lower portion of the reaction tube 203. A vacuum pump 246 serving as a vacuum exhaust apparatus is connected to the exhaust pipe 231 through a pressure sensor 245 and an APC (Automatic Pressure Controller) valve 243. The pressure sensor 245 serves as a pressure detector, and the APC valve 243 serves as a pressure regulator. The vacuum pump 246 is configured to be capable of exhausting (vacuum-exhausting) the inner atmosphere of the process chamber 201 such that an inner pressure of the process chamber 201 reaches and is maintained at a predetermined pressure (vacuum degree) by adjusting an opening degree of the APC valve 243 based on pressure information detected by the pressure sensor 245. The APC valve 243 is configured as an opening/closing valve. That is, the APC valve 243 may be opened or closed to vacuum-exhaust the process chamber 201 or stop the vacuum exhaust, and the opening degree of the APC valve 243 may be adjusted in order to control (or adjust) the inner pressure of the process chamber 201.

As shown in FIG. 1, a furnace opening (also referred to as an "inlet", a "manifold" or a "furnace opening structure") 209 is provided under the reaction tube 203 to be aligned in a manner concentric with the reaction tube 203. For example, the furnace opening 209 is made of a metal such as stainless steel (SUS material) and a nickel (Ni) alloy. For example, the furnace opening 209 is constituted by an upper inlet structure 2091 and a lower inlet structure 2092. Each of the upper inlet structure 2091 and the lower inlet structure 2092 is of a cylindrical shape with open upper and lower ends.

Further, although a first nozzle 233a alone is shown in FIG. 1, a second nozzle (not shown) and a third nozzle (not shown) are also provided similarly to the first nozzle 233a. Each of the first nozzle 233a, the second nozzle (not shown) and the third nozzle (not shown) may be embodied by an L-shaped nozzle including a horizontal portion and a vertical portion. The horizontal portion of each of the first nozzle 233a, the second nozzle and the third nozzle is connected to a side wall of the furnace opening 209, and the vertical portion of each of the first nozzle 233a, the second nozzle and the third nozzle is provided in an arc-shaped space between an inner wall of the inner tube 2032 and the wafers 200 in the process chamber 201 so as to extend upward from a lower portion of the inner tube 2032 toward an upper portion of the inner tube 2032 along the inner wall of the inner tube 2032 in a stacking direction of the wafers 200. A plurality of first gas supply holes 248a through which a process gas is supplied are provided at a side surface of the vertical portion of the first nozzle 233a. Similarly, a plurality of second gas supply holes (not shown) through which the process gas is supplied are provided at a side surface of the vertical portion of the second nozzle (not shown), and a plurality of third gas supply holes (not shown) through which the process gas is supplied are provided at a side surface of the vertical portion of the third nozzle (not shown).

According to the present embodiments, a first gas supplier (which is a first gas supply structure) 232a through which a first process gas is supplied is connected to the first nozzle 233a. Similarly, a second gas supplier (which is a second gas supply structure) (not shown) through which a second process gas is supplied is connected to the second nozzle (not shown), and a third gas supplier (which is a third gas supply structure) (not shown) through which a third process gas is supplied is connected to the third nozzle (not shown).

The upper inlet structure 2091 is provided so as to support the protrusion (also referred to as the "first protrusion" or the "flange") 203A provided at a lower end portion of the outer tube 2031 from thereunder. An O-ring 220a serving as a first seal is provided between an upper surface of the upper inlet structure 2091 and a lower surface of the protrusion 203A of the outer tube 2031. The upper inlet structure 2091 is arranged below the exhaust pipe 231 provided at the lower portion of the reaction tube 203.

The lower inlet structure 2092 is provided with an upper surface 2092c, and the upper surface 2092c of the lower inlet structure 2092 is provided so as to support a lower end portion of the upper inlet structure 2091 and a lower end portion of the inner tube 2032 from thereunder. An O-ring 220b serving as a second seal is provided between a lower surface of the upper inlet structure 2091 and the upper surface 2092c of the lower inlet structure 2092.

A fixing ring (also referred to as a "ring structure") 229 serving as a fixing structure is provided on an upper portion of the upper inlet structure 2091 and on an upper portion of the protrusion 203A of the outer tube 2031. The fixing ring 229 provided on the upper portion of the upper inlet structure 2091 is configured to be connected to the upper inlet structure 2091 and to fix the protrusion 203A from above. A cross-section of a connecting portion between the upper inlet structure 2091 and the fixing ring 229 is of a U shape rotated by 90° to be open toward a horizontal direction. As a result, the outer tube 2031 is stably fixed.

Flow paths 240 and 241 (that is, a first flow path 240 and a second flow path 241) capable of circulating (or supplying) a cooling medium such as a liquid (for example, water) are provided inside the upper inlet structure 2091 and the fixing ring 229, respectively. The protrusion 203A is configured to be capable of being cooled by circulating the cooling medium through the flow paths 240 and 241. Thereby, it is possible to provide a configuration in which a temperature of each component (such as the upper inlet structure 2091 and the lower inlet structure 2092) constituting the furnace opening 209 can be set within a predetermined temperature range. Further, by using the liquid as the cooling medium, as compared with an air cooling method (that is, a cooling method by using a gas such as air), it is possible to efficiently cool a temperature of the reaction tube 203 or the temperature of each component (such as the upper inlet structure 2091 and the lower inlet structure 2092) constituting the furnace opening 209. Further, the first seal 220a is configured to be capable of being protected from a heat by the cooling medium circulating (or flowing) through the first flow path 240.

The flow paths 240 and 241 are arranged such that the protrusion 203A of the outer tube 2031 is interposed (or provided) therebetween in a vertical direction. That is, the first flow path 240 of the upper inlet structure 2091 is arranged below the protrusion 203A, and the second flow path 241 of the fixing ring 229 is arranged above the protrusion 203A. Since the flow paths 240 and 241 are configured such that the protrusion 203A serving as the first protrusion of the reaction tube 203 is interposed therebetween, the cooling medium is arranged above and below the protrusion 203A. Thereby, it is possible to increase a contact area of the reaction tube 203 with the protrusion 203A, and it is also possible to efficiently cool the reaction tube 203.

Figure 2:
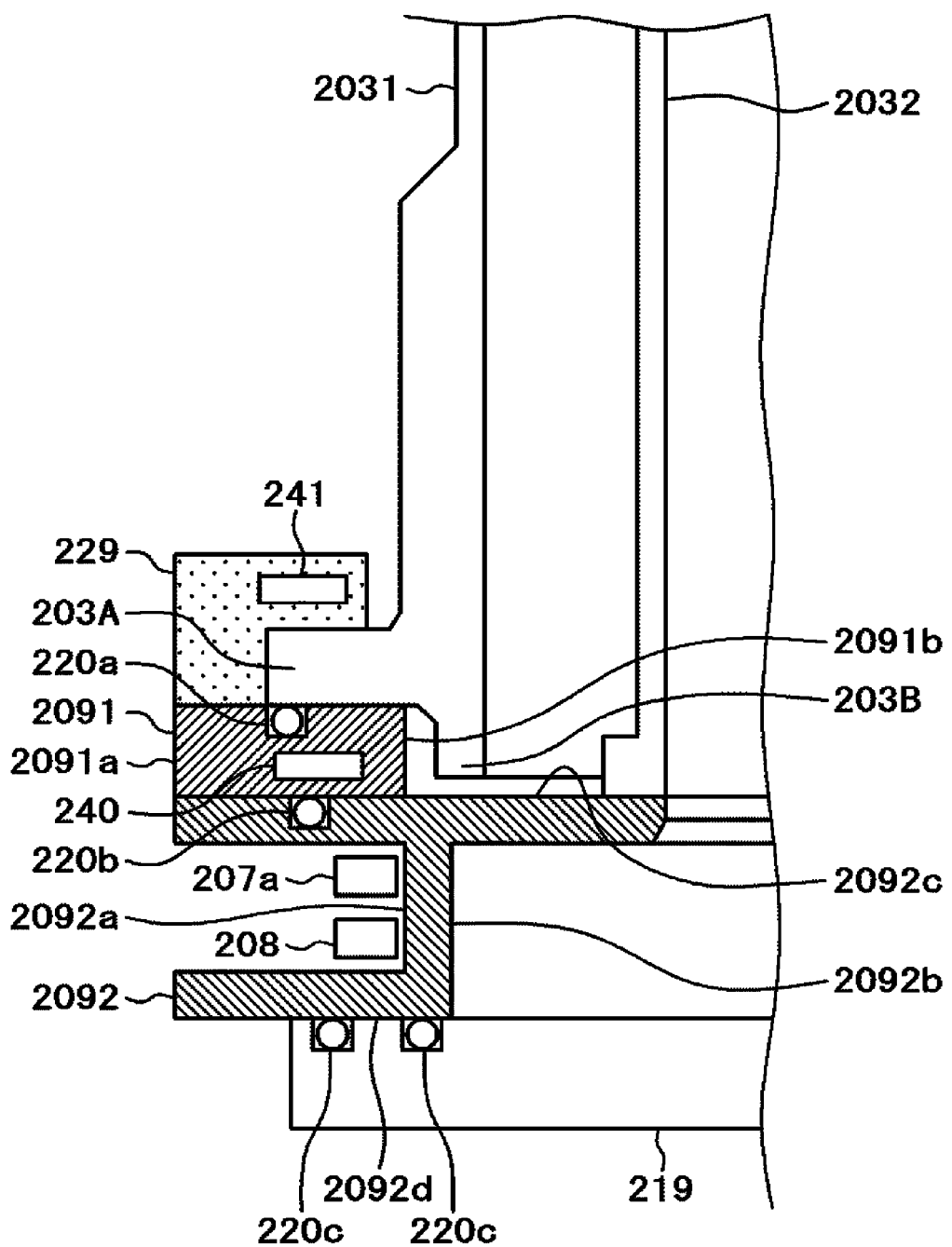
FIG. 2 is a diagram schematically illustrating a cross-section of a lower end of a reaction tube and a vicinity of a furnace opening preferably used in the embodiments of the present disclosure.

As shown in FIG. 2, the protrusion (also referred to as the "second protrusion") 203B configured to be capable of covering at least a part of an inner wall 2091b of the upper inlet structure 2091 is provided at the lower end portion of the outer tube 2031. The protrusion 203B is configured to protrude from the lower end portion of the outer tube 2031 without contacting with the upper surface 2092c of the lower inlet structure 2092, and is configured to cover the inner wall 2091b of the upper inlet structure 2091. As a result, it is possible to prevent (or suppress) by-products generated in a process space in the reaction tube 203 in a depressurized state from adhering to the inner wall 2091b of the upper inlet structure 2091. Further, by reducing (or narrowing) a distance between the protrusion 203B and the inner wall 2091b of the upper inlet structure 2091, it is possible to suppress an excessive decrease in a temperature of the inner wall 2091b of the upper inlet structure 2091. As a result, it is possible to prevent (or suppress) the by-products from adhering to the inner wall 2091b of the upper inlet structure 2091.

By bringing the protrusion 203B close to the inner wall 2091b of the upper inlet structure 2091, it is possible to increase a surface temperature of the inner wall 2091b of the upper inlet structure 2091. Further, by bringing the protrusion 203B close to the lower inlet structure 2092, it is possible to suppress a contact between a surface of the inner wall 2091b of the upper inlet structure 2091 and a gas (which is an exhaust gas).

A seal cap (also referred to as a "lid") 219 serving as a furnace opening lid capable of airtightly sealing (or closing) a lower end opening of the lower inlet structure 2092 is provided under the lower inlet structure 2092 (that, is at the lower end of the lower inlet structure 2092). The seal cap 219 is in contact with the lower end of the lower inlet structure 2092 from thereunder. For example, the seal cap 219 is made of a metal material such as stainless steel (SUS), and is of a disk shape. An O-ring 220c serving as a third seal is provided on an upper surface of the seal cap 219 so as to be in contact with the lower end of the lower inlet structure 2092 (that is, a lower surface 2092d of the lower inlet structure 2092). A space surrounded by the reaction tube 203, the upper inlet structure 2091, the lower inlet structure 2092 and the lid 219 is airtightly sealed (or closed) by the first seal 220a, the second seal 220b and the third seal 220c so as to be capable of being depressurized. As a result, a reaction vessel is constituted by the reaction tube 203, the furnace opening 209 (that is, the upper inlet structure 2091 and the lower inlet structure 2092) and the seal cap 219.

An inlet heater 207a and a temperature sensor (also referred to as a "temperature switch") 208 are provided outside of an outer wall 2092a of the lower inlet structure 2092. The inlet heater 207a is used as a heating structure capable of heating the outer wall 2092a of the lower inlet structure 2092. The temperature sensor 208 is used to measure a temperature of the outer wall 2092a of the lower inlet structure 2092. Since the outer wall 2092a of the lower inlet structure 2092 is capable of being heated by the inlet heater 207a, it is possible to suppress an excessive cooling of the lower inlet structure 2092 due to an influence from the upper inlet structure 2091 cooled by the cooling medium. Further, by detecting the temperature of the outer wall 2092a of the lower inlet structure 2092 (while heating the outer wall 2092a) by the temperature sensor 208, it is possible to detect the excessive cooling of the lower inlet structure 2092. Therefore, it is possible to further suppress the excessive cooling of the lower inlet structure 2092 due to the influence from the upper inlet structure 2091 cooled by the cooling medium (for example, the liquid). Further, a seal cap heater (not shown) capable of heating the seal cap 219 may be provided on a lower portion of the seal cap 219.

A rotator 267 configured to rotate the boat 217 described later is provided under the seal cap 219 opposite to the process chamber 201. For example, a rotating shaft 255 of the rotator 267 is connected to the boat 217 through the seal cap 219. As the rotator 267 rotates the boat 217, the wafers 200 accommodated in the boat 217 are rotated. The boat 217 and the seal cap 219 is configured to be elevated or lowered in the vertical direction by a boat elevator 215 serving as an elevator provided outside the reaction tube 203. Thereby, the boat 217 may be transferred (loaded) into the process chamber 201 or transferred (unloaded) out of the process chamber 201. For example, the boat 217 is made of a material such as quartz ($SiO_2$) and silicon carbide (SiC).

For example, a heat insulator 218 made of a heat resistant material such as quartz ($SiO_2$) and silicon carbide (SiC) is provided below the boat 217. The heat insulator 218 is configured to suppress a transmission of the heat from the heater 207 to the seal cap 219.

Figure 3:
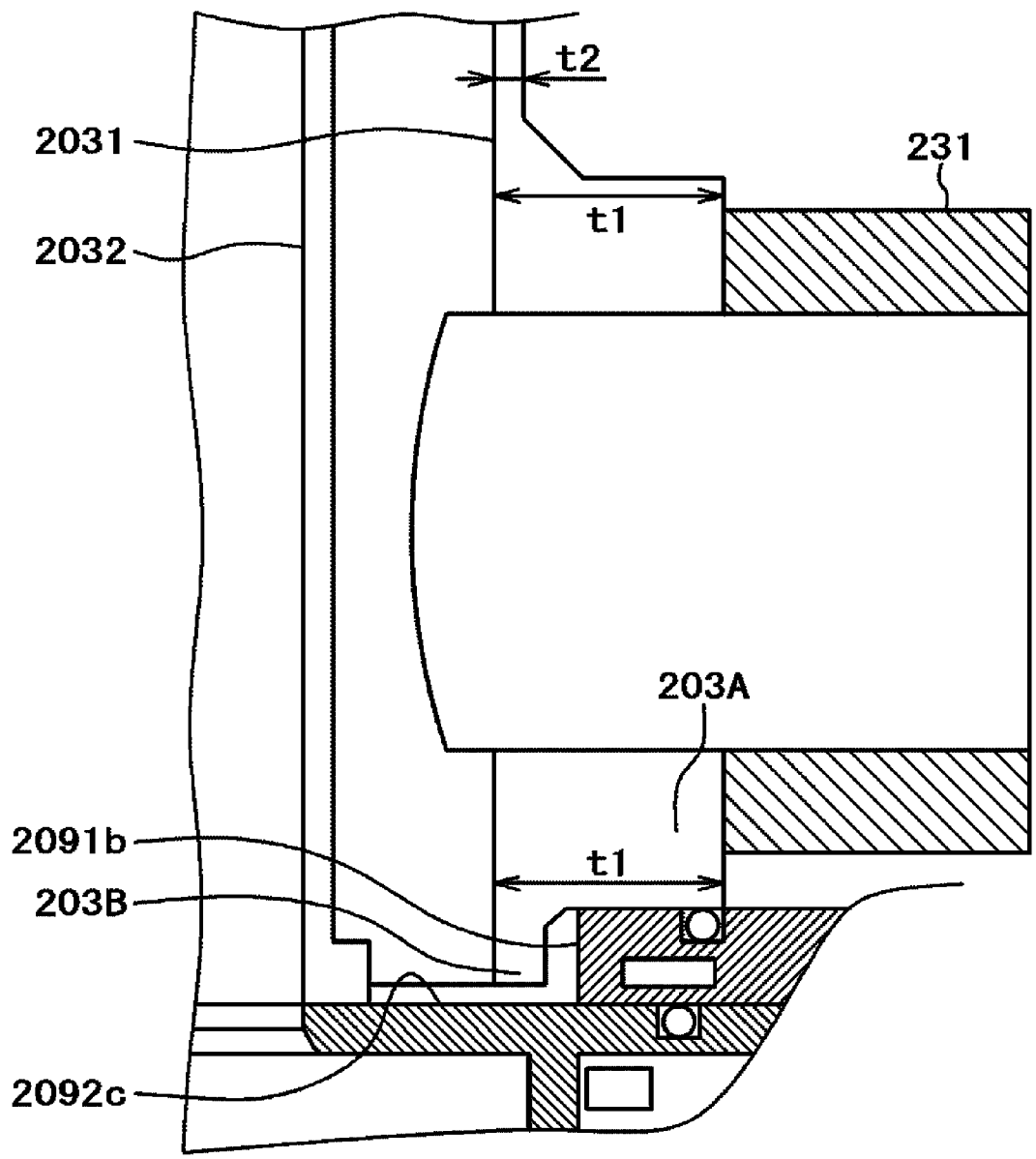
FIG. 3 is a diagram schematically illustrating a cross-section of the lower end of the reaction tube and the vicinity of the furnace opening (where an exhaust pipe is connected) preferably used in the embodiments of the present disclosure.

As shown in FIG. 3, the exhaust pipe 231 is provided at the lower end portion of the outer tube 2031 of the reaction tube 203. A thickness "t1" of a portion of the outer tube 2031 where the exhaust pipe 231 is provided is set to be greater than a thickness "t2" of the other portion of the outer tube 2031 where the exhaust pipe 231 is provided (that is, t1>t2). Further, the fixing ring 229 is not provided at a lower portion of the exhaust pipe 231 and the upper portion of the protrusion 203A of the outer tube 2031 corresponding to the lower portion of the exhaust pipe 231. As a result, since the exhaust pipe 231 is capable of being provided in the reaction tube 203 in such a state, it is possible to reduce metal components (such as the fixing ring 229) constituting the furnace opening 209, and it is also possible to suppress a risk of a metal contamination.

Figure 4:
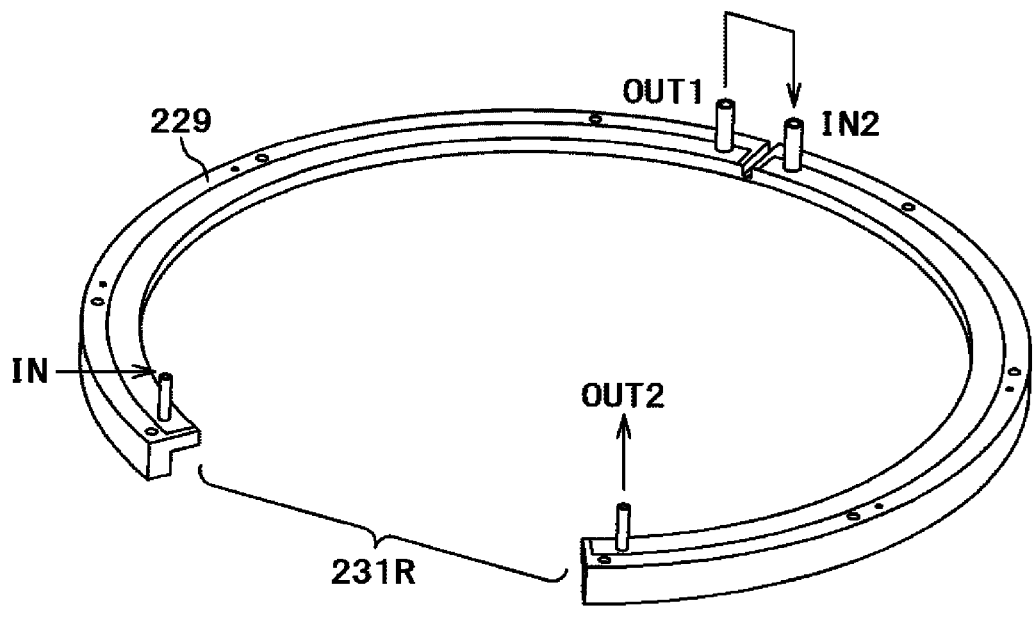
FIG. 4 is a diagram schematically illustrating a fixing ring and an upper inlet structure preferably used in the embodiments of the present disclosure.
Figure 4:
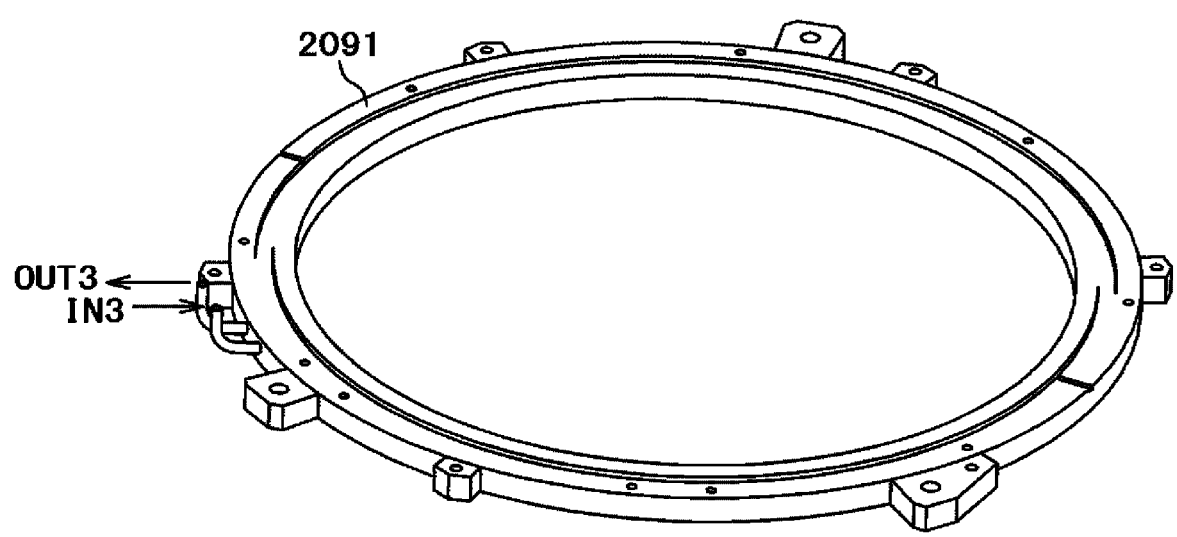

As shown in FIG. 4, the fixing ring 229 is of a C-shaped configuration open at a gap region 231R in which the exhaust pipe 231 is inserted. The fixing ring 229 is provided with a cooling medium supplier (which is a cooling medium supply structure) IN1 to which the cooling medium is supplied, a connection output structure OUT1 to which the cooling medium supplied through the cooling medium supplier IN1 is output, a connection input structure IN2 connected to the connection output structure OUT1 and a cooling medium discharger (which is a cooling medium discharge structure) OUT2 through which the cooling medium supplied to the connection input structure IN2 is output. On the other hand, the upper inlet structure 2091 is provided with a cooling medium supplier (which is a cooling medium supply structure) IN3 to which the cooling medium is supplied and a cooling medium discharger (which is a cooling medium discharge structure) OUT3 to which the cooling medium supplied through the cooling medium supplier IN3 is output. That is, the upper inlet structure 2091 and the fixing ring 229 are provided with the cooling medium supplier IN3 and the cooling medium supplier IN1, respectively, so as to individually supply the cooling medium. Thereby, it is possible to provide the configuration in which the temperature of each component (such as the upper inlet structure 2091 and the lower inlet structure 2092) constituting the furnace opening 209 can be set within the predetermined temperature range.

<Controller>

Figure 5:
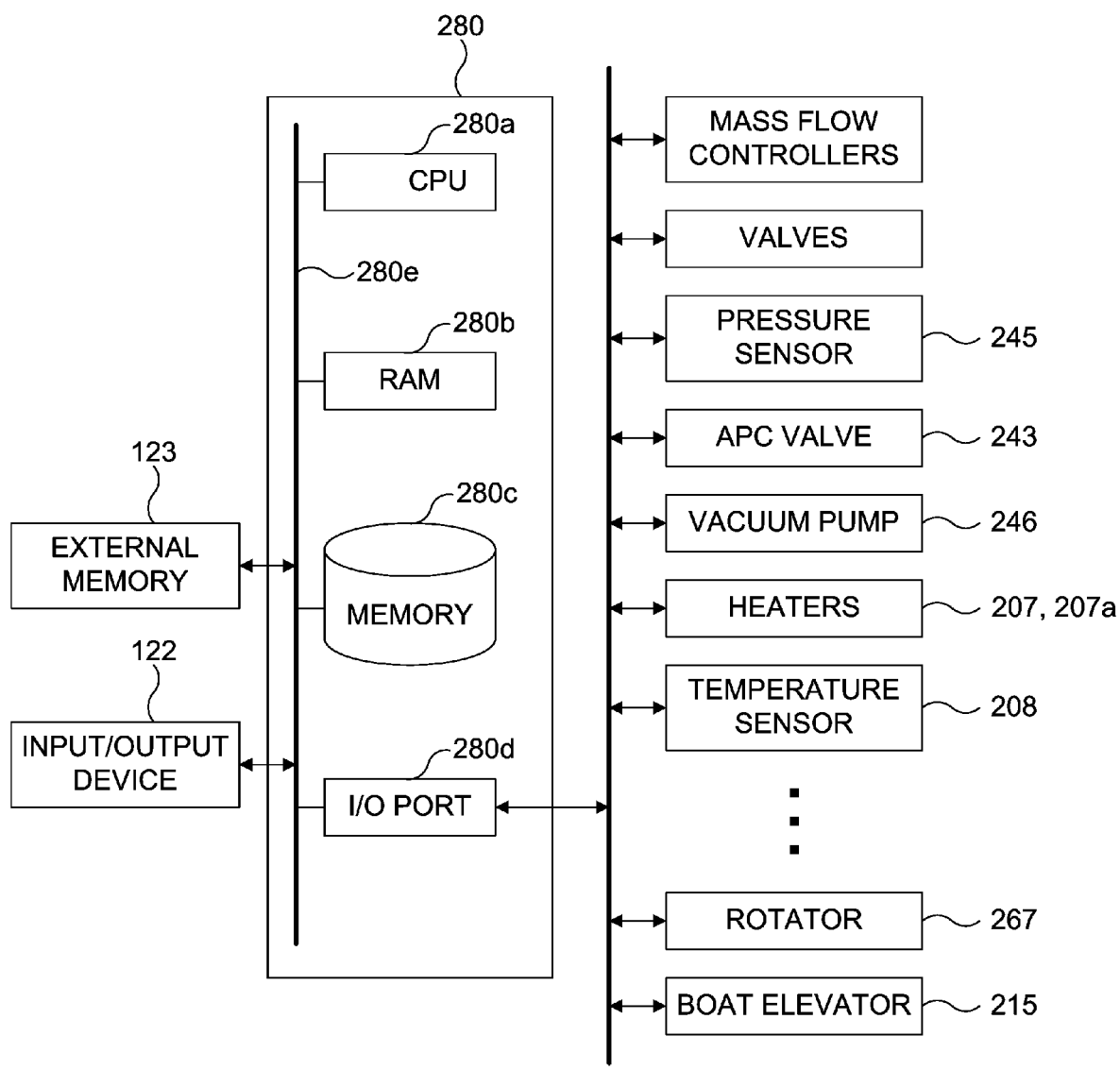
FIG. 5 is a block diagram schematically illustrating a configuration of a controller and related components of the substrate processing apparatus preferably used in the embodiments of the present disclosure.

As shown in FIG. 5, for example, a controller 280 serving as a control structure (control apparatus) may be constituted by a computer including a CPU (Central Processing Unit) 280a, a RAM (Random Access Memory) 280b, a memory 280c and an I/O port 280d. The RAM 280b, the memory 280c and the I/O port 280d may exchange data with the CPU 280a through an internal bus 280e. For example, an input/output device 122 constituted by a component such as a touch panel is connected to the controller 280.

For example, the memory 280c is configured by a component such as a flash memory and a hard disk drive (HDD). For example, a control program configured to control operations of the substrate processing apparatus 100 or a process recipe containing information on sequences and conditions of a substrate processing described later may be readably stored in the memory 280c. The process recipe is obtained by combining steps (sequences) of the substrate processing described later such that the controller 280 can execute the steps to acquire a predetermined result, and functions as a program. Hereinafter, the process recipe and the control program may be collectively or individually referred to as a "program". Thus, in the present specification, the term "program" may refer to the process recipe alone, may refer to the control program alone, or may refer to both of the process recipe and the control program. The RAM 280b functions as a memory area (work area) where a program or data read by the CPU 280a is temporarily stored.

The I/O port 280d is connected to the above-described components such as MFCs (mass flow controllers) (not shown) serving as flow rate controllers capable of controlling flow rates of gases supplied through the first gas supplier 232a, the second gas supplier (not shown) and the third gas supplier (not shown), opening/closing valves (not shown) provided corresponding to the MFCs, the pressure sensor 245, the APC valve 243, the vacuum pump 246, the heaters 207 and 207a, the temperature sensor 208, the rotator 267 and the boat elevator 215.

The CPU 280a is configured to read the control program from the memory 280c and execute the read control program. In addition, the CPU 280a is configured to read the process recipe from the memory 280c in accordance with an operation command inputted from the input/output device 122. In accordance with the contents of the read process recipe, the CPU 280a is configured to be capable of controlling various operations such as an operation of the APC valve 243, operations of the heaters 207 and 207a, an operation of the vacuum pump 246, an operation of the rotator 267 and an operation of the boat elevator 215. The CPU 280a is further configured to be capable of controlling the inlet heater 207a based on a signal from the temperature sensor 208. That is, the CPU 280a is configured to control a turning-on state ("ON" state) and a turning-off state ("OFF" state) of the inlet heater 207a based on a temperature detected by the temperature sensor 208.

The memory 280c is configured to store data indicating a correlation among a pre-set temperature (that is, a process temperature) of the heater 207 serving as a heating structure, a temperature of a pre-designated portion of the upper inlet structure 2091 and a temperature of a pre-designated portion of the lower inlet structure 2092. The pre-set temperature of the heater 207 is configured to be capable of being adjusted to a first temperature (420° C.) or higher.

Then, referring to the data indicating the correlation, the CPU 280a controls the inlet heater 207a provided in the lower inlet structure 2092 in accordance with the pre-set temperature of the heater 207. For example, when the pre-set temperature of the heater 207 is at the first temperature ("T1") or higher, the inlet heater 207a provided on the outer wall 2092a of the lower inlet structure 2092 is turned off. On the other hand, for example, when the pre-set temperature of the heater 207 is lower than the first temperature (T1), the inlet heater 207a is turned on, and the temperature of each component (such as the upper inlet structure 2091 and the lower inlet structure 2092) constituting the furnace opening 209 is capable of being controlled within a predetermined temperature range. Further, since the outer wall 2092a can be heated, it is possible to provide the configuration capable of suppressing the excessive cooling of the inner wall 2091b of the upper inlet structure 2091 and an inner wall of the lower inlet structure 2092 by the cooling medium.

In the present specification, the term "predetermined temperature range" may refer to a temperature range of equal to or higher than a temperature (which is a vaporization temperature of the by-products) at which the by-products do not adhere to each component constituting the furnace opening 209, and is equal to or lower than a temperature at which the metal contamination does not occur in each component constituting the furnace opening 209. For example, the predetermined temperature range may be set to be within a range of 180° C. or higher and 350° C. or lower. Therefore, it is possible to provide the configuration in which the temperature of each component (such as the upper inlet structure 2091 and the lower inlet structure 2092) constituting the furnace opening 209 can be set within the predetermined temperature range.

Further, according to the present embodiments, since the configuration in which the temperature of each component (such as the upper inlet structure 2091 and the lower inlet structure 2092) constituting the furnace opening 209 can be set within the predetermined temperature range is provided, it is possible to suppress an adhesion of the by-products generated in the process space in a double-tube type structure of the reaction tube 203 (that is, the outer tube 2031 and the inner tube 2032).

The controller 280 is not limited to a dedicated computer, and the controller 280 may be embodied by a general-purpose computer. For example, the controller 280 according to the present embodiments may be embodied by preparing an external memory 123 (e.g., a magnetic tape, a magnetic disk such as a flexible disk and a hard disk, an optical disk such as a CD and a DVD, a magneto-optical disk such as an MO, a semiconductor memory such as a USB memory and a memory card) in which the above-described program is stored, and by installing the program onto the general-purpose computer by using the external memory 123. However, a method of providing the program to the computer (that is, the general-purpose computer) is not limited to the method using the external memory 123. For example, the program may be directly provided to the computer by using a communication instrument such as the Internet and a dedicated line instead of the external memory 123. In addition, the memory 280c and the external memory 123 may be embodied by a non-transitory computer-readable recording medium. Hereinafter, the memory 280c and the external memory 123 may be collectively or individually referred to as a recording medium. Thus, in the present specification, the term "recording medium" may refer to the memory 280c alone, may refer to the external memory 123 alone, or may refer to both of the memory 280c and the external memory 123. The data indicating the correlation among the pre-set temperature (that is, the process temperature) of the heater 207 serving as the heating structure, the temperature of the pre-designated portion of the upper inlet structure 2091 and the temperature of the pre-designated portion of the lower inlet structure 2092 may be stored in the external memory 123 such that the controller 280 (more specifically, the CPU 280a) can refer to the data indicating the correlation.

Figure 6:
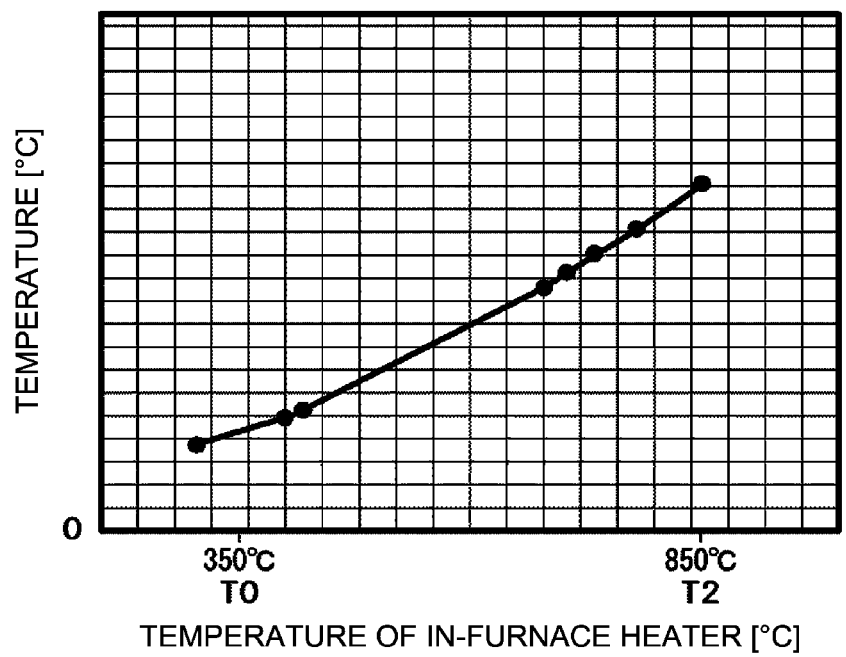
FIG. 6 is a graph schematically illustrating a temperature of an outer wall of a lower inlet structure according to a comparative example.
Figure 7:
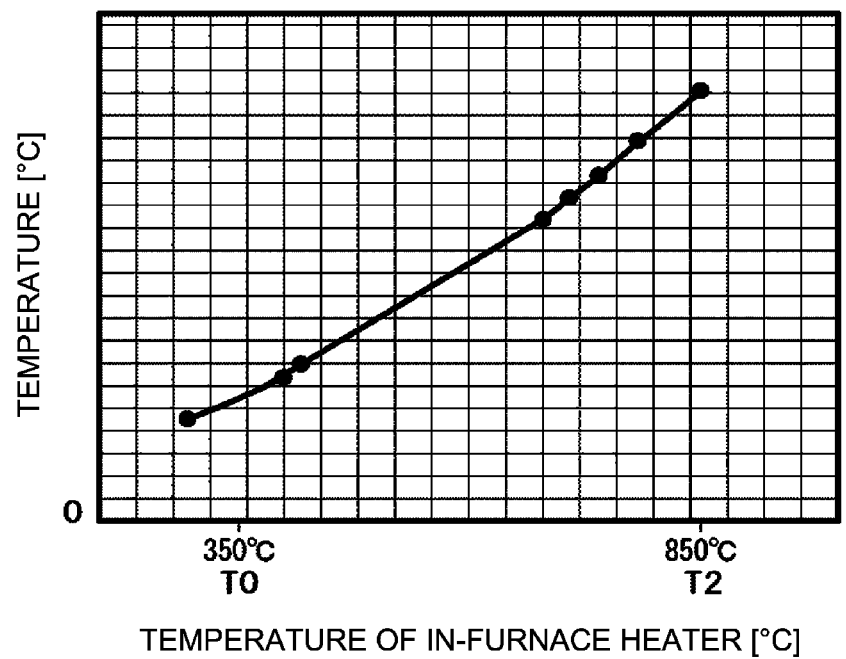
FIG. 7 is a graph schematically illustrating a temperature of a lower portion of a seal cap corresponding to a lower portion of the lower inlet structure according to the comparative example.
Figure 8:
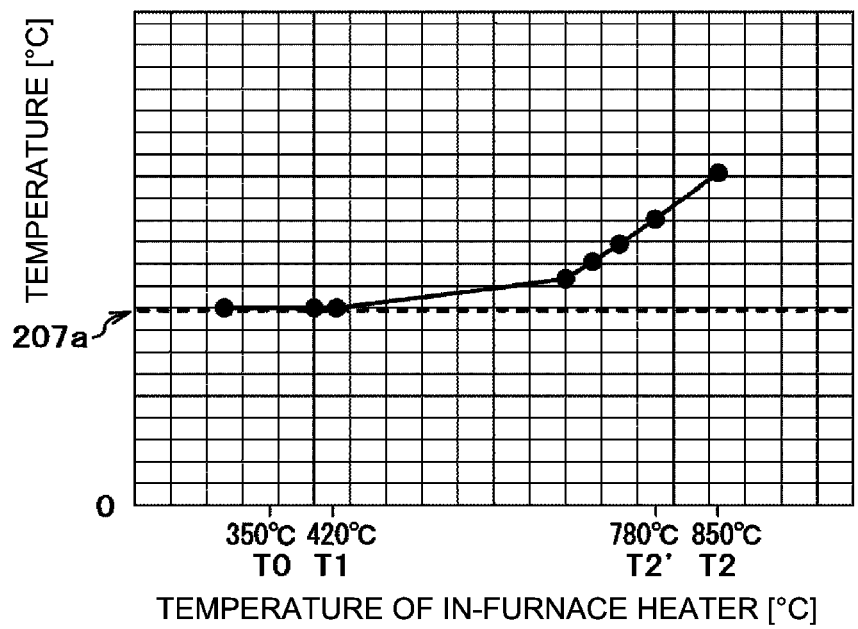
FIG. 8 is a graph schematically illustrating the temperature of the outer wall of the lower inlet structure according to the embodiments of the present disclosure.
Figure 9:
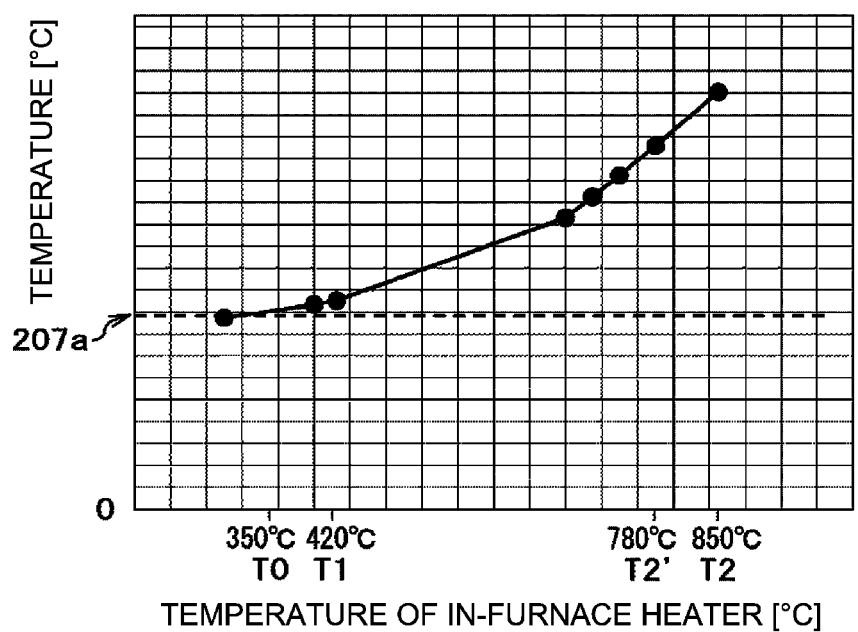
FIG. 9 is a graph schematically illustrating the temperature of the lower portion of the seal cap corresponding to the lower portion of the lower inlet structure according to the embodiments of the present disclosure.

Subsequently, with respect to the temperature of the outer wall 2092a of the lower inlet structure 2092 and a temperature of the lower portion (of an outer periphery) of the seal cap 219 corresponding to the lower portion of the lower inlet structure 2092, a comparative example and a configuration example according to the embodiments of the present disclosure will be described with reference to FIGS. 6 through 9. In the present specification. Each of FIGS. 6 and 7 schematically illustrates a case where the inlet heater 207a is not provided on the outer wall 2092a of the lower inlet structure 2092. FIGS. 8 and 9 schematically illustrate a case where the inlet heater 207a is provided on the outer wall 2092a of the lower inlet structure 2092.

In FIGS. 6 through 9, when the pre-set temperature of the heater 207 (indicated as "IN-FURNACE HEATER") is equal to or higher than T0 (350° C.) and equal to or lower than T2 (850° C.) and a temperature of the cooling water serving as the cooling medium is constant at 50° C., the temperature of each component (such as the outer wall 2092a of the lower inlet structure 2092 and the lower portion of the seal cap 219 corresponding to the lower portion of the lower inlet structure 2092) is shown. In FIGS. 8 and 9, when the pre-set temperature of the inlet heater 207a is set to 180° C. and the pre-set temperature of the heater ("IN-FURNACE HEATER") 207 is equal to or higher than T0 and equal to or lower than T1 (that is, when the pre-set temperature of the heater 207 is equal to or lower than T1 serving as the first temperature), the inlet heater 207a is controlled to be in the turning-on state ("ON" state), and when the pre-set temperature of the heater ("IN-FURNACE HEATER") 207 is equal to or higher than T1 serving as the first temperature, the inlet heater 207a is controlled to be in the turning-off state ("OFF" state).

As shown in FIG. 6, when the pre-set temperature of the heater 207 is equal to or lower than t1, the temperature of the outer wall 2092a of the lower inlet structure 2092 may be lowered by a temperature drop (180° C. or less) due to the excessive cooling, and there may be a risk of the adhesion of the by-products. On the other hand, even when the pre-set temperature of the heater 207 is equal to t2, since the temperature of the outer wall 2092a of the lower inlet structure 2092 can be set to be lower than the temperature at which metal contamination occurs (350° C.), it is possible to reduce the risk of the metal contamination.

As shown in FIG. 7, when the pre-set temperature of the heater 207 is equal to or lower than t3, the temperature of the lower portion of the seal cap 219 may be lowered by the temperature drop (180° C. or less) due to the excessive cooling, and there may be the risk of the adhesion of the by-products. On the other hand, when the pre-set temperature of the heater 207 is equal to higher than about t4, since the temperature of the lower portion of the seal cap 219 is higher than the temperature at which the metal contamination occurs (350° C.), there may be the risk of the metal contamination.

As shown in FIG. 8, when the pre-set temperature of the heater 207 is equal to or higher than T0 and equal to or lower than T2, by using a component such as the inlet heater 207a, the temperature of the outer wall 2092a of the lower inlet structure 2092 can be set to be within a predetermined temperature range, that is, a temperature range of equal to or higher than the temperature (which is the vaporization temperature of the by-products, for example, 180° C. in the present embodiments) at which the by-products do not adhere to each component constituting the furnace opening 209 and equal to or lower than the temperature (for example, 350° C. in the present embodiments) at which the metal contamination does not occur. Similarly, when the pre-set temperature of the heater 207 is equal to or higher than T0 and equal to or lower than T2, a temperature of a gas contact portion (that is, the inner wall) of the lower inlet structure 2092 can be set within the predetermined temperature range. Therefore, it is possible to reduce the risk of the adhesion of the by-products, and it is also possible to reduce the risk of the metal contamination. It is preferable to perform a coating process on the gas contact portion (that is, the inner wall) of the lower inlet structure 2092 to form a coating film. By forming the coating film on the gas contact portion (that is, the inner wall) of the lower inlet structure 2092 as described above, it is possible to further prevent the adhesion of the by-products to the gas contact portion (that is, the inner wall) of the lower inlet structure 2092. In the present specification, According the present embodiments, the "gas contact portion" (that is, the inner wall) of the lower inlet structure 2092 refers to an inner wall of a portion of the reaction vessel (which is constituted by the reaction tube 203, the furnace opening 209 (that is, the upper inlet structure 2091 and the lower inlet structure 2092) and the seal cap 219) that is in contact with the gas.

As shown in FIG. 9, when the pre-set temperature of the heater 207 is equal to or higher than T0 and equal to or lower than T2', by using the component such as the inlet heater 207a, the temperature of the lower portion of the seal cap 219 can be set within the predetermined temperature range.

As shown in FIGS. 8 and 9, when the pre-set temperature of the heater 207 is equal to or higher than T0 and equal to or lower than T2', by using the component such as the inlet heater 207a, the temperature of the outer wall 2092a of the lower inlet structure 2092 and the temperature of the lower portion of the seal cap 219 can be set within the predetermined temperature range. As a result, it is possible to reduce the adhesion of the by-products and the metal contamination.

<Substrate Processing>

Subsequently, a method of manufacturing a semiconductor device according to the embodiments of the present disclosure will be described. The method of manufacturing the semiconductor device will be described by way of an example in which the substrate processing apparatus 100 (which is a CVD apparatus) shown in FIG. 1 is prepared (that is, a preparation step of the substrate processing apparatus is performed), the wafers 200 are transferred (loaded) into the process chamber 201 of the substrate processing apparatus 100 (that is, a loading step of the substrate into the process chamber is performed), and a processing step of the substrate is performed (that is, an ammonia annealing process on the wafers 200 in the process chamber 201 is performed and then a film-forming process of forming a silicon nitride ($Si_3N_4$) film is performed).

The plurality of wafers 200 are transferred (charged) into the boat 217 by a wafer transfer device such that the plurality of wafers 200 are arranged parallel to one another with their centers aligned in the boat 217 (wafer charging step). As shown in FIG. 1, by elevating the seal cap 219 by the boat elevator 215, the boat 217 with the wafers 200 charged therein is transferred (loaded) into the process chamber 201 through the furnace opening 209, and the boat 217 is located in the process chamber 201 while being supported by the seal cap 219 (boat loading step).

When charging the wafers 200 or loading the boat 217, the heater 207 heats the process chamber 201 at a predetermined temperature such that a predetermined temperature distribution can be obtained in the process chamber 201. In such a state, the O-ring 220c of the seal cap 219 airtightly seals the furnace opening 209. Further, the cooling water is circulated through each of the flow paths 240 and 241, and as a result, the upper inlet structure 2091 and the fixing ring 229 are cooled. When cooling the upper inlet structure 2091 and the fixing ring 229, the controller 280 controls the inlet heater 207a based on the pre-set temperature of the heater 207 and temperature detection results from the temperature sensor 208 such that a temperature of the lower inlet structure 2092 and a temperature of the outer periphery of the seal cap 219 can be maintained at a predetermined value set in advance.

Subsequently, the process chamber 201 is exhausted through the exhaust pipe 231 such that the pressure of the process chamber 201 reaches and is maintained at a predetermined pressure (from several tens of Pa to around an atmospheric pressure). Further, the temperature of the process chamber 201 is elevated by the heater 207 with a predetermined temperature such that a predetermined temperature distribution can be obtained in the process chamber 201. When exhausting the process chamber 201 or elevating the temperature of the process chamber 201, the cooling water is circulated through each of the flow paths 240 and 241, and as a result, the upper inlet structure 2091, the fixing ring 229 and the lower inlet structure 2092 are cooled. Further, the controller 280 controls the inlet heater 207a based on the pre-set temperature of the heater 207 and the temperature detection results from the temperature sensor 208 such that the temperature of the lower inlet structure 2092 and the temperature of the outer periphery of the seal cap 219 are maintained at a predetermined value set in advance.

When the temperature of the process chamber 201 and the pressure of the process chamber 201 are stabilized, an annealing gas is supplied to the process chamber 201 of the inner tube 2032 through the first gas supplier 232a. At least during an annealing process (for example, the ammonia annealing process described above) of supplying the annealing gas, the boat 217 is rotated by the rotator 267.

The annealing gas supplied to the process chamber 201 flows upward in the process chamber 201 of the inner tube 2032, flows out through an upper end opening toward an exhaust path defined by a gap between the inner tube 2032 and the outer tube 2031, and is exhausted through the exhaust pipe 231. A surface of the wafer 200 is annealed while the process chamber 201 is filled with the annealing gas.

After a pre-set process time of performing the annealing process has elapsed, subsequently, the process chamber 201 is exhausted to a predetermined vacuum degree (from several tens of Pa to tens of thousands of Pa).

The temperature of the process chamber 201 is lowered by the heater 207 with a predetermined temperature such that a predetermined temperature distribution can be obtained in the process chamber 201. When lowering the temperature of the process chamber 201, the cooling water is circulated through each of the flow paths 240 and 241, and as a result, the upper inlet structure 2091, the fixing ring 229 and the lower inlet structure 2092 are cooled. Further, the controller 280 controls the inlet heater 207a based on the pre-set temperature of the heater 207 and the temperature detection results from the temperature sensor 208 such that the temperature of the lower inlet structure 2092 and the temperature of the outer periphery of the seal cap 219 are maintained at a predetermined value set in advance.

When the temperature of the process chamber 201 and the pressure of the process chamber 201 are stabilized, a film-forming gas is supplied to the process chamber 201 of the inner tube 2032 through the second gas supplier (not shown) and the third gas supplier (not shown). At least during the film-forming process of supplying the film-forming gas, the boat 217 is rotated by the rotator 267.

The film-forming gas supplied to the process chamber 201 flows upward in the process chamber 201 of the inner tube 2032, flows out through the upper end opening toward the exhaust path defined by the gap between the inner tube 2032 and the outer tube 2031, and is exhausted through the exhaust pipe 231. When the film-forming gas passes through the process chamber 201, the film-forming gas is in contact with the surface of the wafer 200. As a result, a film is deposited on the surface of the wafer 200 due to a thermal reaction of the film-forming gas that is in contact with the wafer 200.

After a pre-set process time of depositing the film of a desired thickness has elapsed, an inert gas such as nitrogen gas serving as a replacement gas is supplied to the process chamber 201 through the third gas supplier (not shown), and the film-forming gas and a reactive gas are exhausted from the process chamber 201. Thereby, the inner atmosphere of the process chamber 201 is replaced with the inert gas. When the inner atmosphere of the process chamber 201 is completely replaced with the inert gas and the pressure of the process chamber 201 is at the atmospheric pressure, the seal cap 219 is lowered to open the furnace opening 209, and the wafers 200 supported by the boat 217 are transferred (unloaded) through the furnace opening 209 to a stand-by chamber provided directly below the reaction tube 203 (boat unloading step).

According to the present embodiments, it is possible to obtain one or more of the following effects.

(1) By circulating (or supplying) the cooling medium through the flow paths 240 and 241 provided inside the upper inlet structure 2091 and the fixing ring 229, respectively, the first protrusion 203A is configured to be capable of being cooled. Thereby, it is possible to provide the configuration in which the temperature of each component (such as the upper inlet structure 2091 and the lower inlet structure 2092) constituting the furnace opening 209 can be set within the predetermined temperature range.

(2) The second protrusion 203B configured to be capable of covering at least a part of the inner wall 2091b of the upper inlet structure 2091 is provided at a lower end of the reaction tube 203 (that is, the lower end of the outer tube 2031). Further, the second protrusion 203B is configured to protrude from a lower end portion of the reaction tube 203 (that is, the lower end portion of the outer tube 2031) so as to cover the inner wall 2091b of the upper inlet structure 2091 without being in contact with the lower inlet structure 2092. As a result, it is possible to prevent (or suppress) the by-products from adhering to the inner wall 2091b of the upper inlet structure 2091. In particular, by reducing (or narrowing) the distance between the second protrusion 203B and the inner wall 2091b, it is possible to suppress the excessive decrease in the temperature of the inner wall 2091b. As a result, it is possible to further prevent (or suppress) the by-products from adhering to the inner wall 2091b of the upper inlet structure 2091.

(3) The cooling medium circulated in the flow paths 240 and 241 is configured as the liquid such as water (that is, a cooling method by using the water is used). By configuring the cooling medium as the liquid, it is possible to efficiently cool the temperature of the reaction tube 203 as compared with the air cooling method (that is, the cooling method by using the gas such as air).

(4) The inlet heater 207a serving as a heating structure capable of heating the outer wall 2092a of the lower inlet structure 2092 is provided at the lower inlet structure 2092. Since the outer wall 2092a is capable of being heated by the inlet heater 207a, it is possible to suppress the excessive cooling of the lower inlet structure 2092 due to the influence from the upper inlet structure 2091 cooled by the cooling medium (for example, the liquid).

(5) The thickness "t1" of the portion of the reaction tube 203 (that is, the outer tube 2031) where the exhaust pipe 231 is provided is set to be greater than the thickness "t2" of the other portion of the reaction tube 203 (the outer tube 2031) (that is, t1>t2). As a result, since the exhaust pipe 231 is capable of being provided in the reaction tube 203 in such a state, it is possible to reduce the metal components (such as the fixing ring 229 of the C-shaped configuration) constituting the furnace opening 209, and it is also possible to suppress the risk of the metal contamination.

(6) The lid 219 connected to the lower inlet structure 2092 via the third seal 220c is provided, and the space surrounded by the reaction tube 203, the upper inlet structure 2091, the lower inlet structure 2092 and the lid 219 is airtightly sealed (or closed) by the first seal 220a, the second seal 220b and the third seal 220c so as to be capable of being depressurized. Since the configuration in which the temperature of each component (such as the upper inlet structure 2091 and the lower inlet structure 2092) constituting the furnace opening 209 can be set within the predetermined temperature range is provided, it is possible to suppress the adhesion of the by-products generated in the process space in the depressurized state.

(7) The cross-section of the connecting portion between the upper inlet structure 2091 and the fixing ring 229 is of a U shape rotated by 90° to be open toward the horizontal direction. Further, the first flow path 240 of the upper inlet structure 2091 is arranged below the first protrusion 203A, and the second flow path 241 of the fixing ring 229 is arranged above the first protrusion 203A. Thereby, the flow paths 240 and 241 are configured such that the first protrusion 203A of the reaction tube 203 (that is, the outer tube 2031) is interposed therebetween. As a result, since the cooling medium is arranged above and below the first protrusion 203A, it is possible to increase the contact area of the reaction tube 203 with the first protrusion 203A, and it is also possible to efficiently cool the reaction tube 203.

(8) The reaction tube 203 is constituted by: the inner tube (also referred to as the inner reaction tube) 2032 in which the process chamber 201 where the wafer 200 is processed is provided; and the outer tube (also referred to as the outer reaction tube) 2031 provided outside of the inner tube 2032 so as to surround the inner tube 2032. The upper inlet structure 2091 is configured to support the outer tube (outer reaction tube) 2031, and the lower inlet structure 2092 is configured to support the inner tube (inner reaction tube) 2032. Since the configuration in which the temperature of each component (such as the upper inlet structure 2091 and the lower inlet structure 2092) constituting the furnace opening 209 can be set within the predetermined temperature range is provided, it is possible to suppress the adhesion of the by-products generated in the process space in the double-tube type structure of the reaction tube 203.

(9) The coating process is performed on the inner wall of the lower inlet structure 2092. By coating the gas contact portion (that is, the inner wall) of each component (such as the upper inlet structure 2091 and the lower inlet structure 2092) constituting the furnace opening 209, it is possible to suppress the adhesion of the by-products.

(10) The temperature sensor (also referred to as the "temperature switch") 208 is provided at the outer wall 2092a of the lower inlet structure 2092. The temperature sensor 208 is configured to be capable of detecting a temperature set in advance (for example, the pre-set temperature of the heater 207a: 180° C.). For example, the substrate processing apparatus 100 is further provided with the controller 280 configured to be capable of controlling the inlet heater 207a (that is, a heating of the inlet heater 207a) based on the signal from the temperature sensor 208 when the temperature of the outer wall 2092a of the lower inlet structure 2092 is lower than the temperature set in advance (for example, the pre-set temperature of the heater 207a: 180° C.). Further, by detecting the temperature of the outer wall 2092a of the lower inlet structure 2092 by the temperature sensor 208 while heating the outer wall 2092a, it is possible to detect the excessive cooling of the lower inlet structure 2092. Therefore, it is possible to further suppress the excessive cooling of the lower inlet structure 2092 due to the influence from the upper inlet structure 2091 cooled by the cooling medium (for example, the liquid).

(11) The heater 207 serving as a heating structure capable of heating the process chamber 201 is provided outside of the outer tube 2031, and the pre-set temperature of the heater 207 is configured to be capable of being adjusted to the first temperature ("T1") or higher. Further, the upper inlet structure 2091 and the ring structure (that is, the fixing ring 229) are provided with the cooling medium supplier IN3 and the cooling medium supplier IN1, respectively, so as to individually supply the cooling medium (see FIG. 4). As a result, it is possible to provide the configuration in which the temperature of each component (such as the upper inlet structure 2091 and the lower inlet structure 2092) constituting the furnace opening 209 can be set within the predetermined temperature range (according to the present embodiments, the range of 180° C. or higher and 350° C. or lower) when the pre-set temperature of the heater 207 is equal to or higher than the first temperature.

(12) The controller 280 included in the substrate processing apparatus 100 is configured to control the inlet heater 207a provided on the outer wall 2092a of the lower inlet structure 2092 such that the inlet heater 207a is turned off when the pre-set temperature of the heater 207 is equal to or higher than the first temperature (T1), and the inlet heater 207a is turned on such that the temperature of each component (such as the upper inlet structure 2091 and the lower inlet structure 2092) constituting the furnace opening 209 is controlled within the predetermined temperature range (according to the present embodiments, the range of 180° C. or higher and 350° C. or lower) when the pre-set temperature of the heater 207 is lower than the first temperature (T1). As a result, it is possible to provide the configuration in which the temperature of each component (such as the upper inlet structure 2091 and the lower inlet structure 2092) constituting the furnace opening 209 can be set within the predetermined temperature range (according to the present embodiments, the range of 180° C. or higher and 350° C. or lower) when the pre-set temperature of the heater 207 is equal to or higher than the first temperature. Further, since the outer wall 2092a is capable of being heated by the inlet heater 207a, it is possible to provide the configuration capable of suppressing the excessive cooling of the inner wall 2091b of the upper inlet structure 2091 and the inner wall of the lower inlet structure 2092 by the cooling medium.

Other Embodiments

While the technique of the present disclosure is described in detail by way of the embodiments and the examples described above, the technique of the present disclosure is not limited thereto. The technique of the present disclosure may be modified in various ways without departing from the scope thereof.

The technique of the present disclosure is not limited to a semiconductor manufacturing apparatus, and may also be applied to a glass substrate processing apparatus such as an LCD apparatus. Further, the substrate processing of forming the film (that is, a film-forming process) may include a process such as a CVD process, a PVD process, a process of forming an oxide film, a process of forming a nitride film, a process of forming both of the oxide film and the nitride film and a process of forming a film containing a metal. The technique of the present disclosure is not limited to the film-forming process. For example, in addition to or instead of the film-forming process, a process such as an annealing process, an oxidation process, a nitridation process and a diffusion process may be performed as the substrate processing.

According to some embodiments of the present disclosure, it is possible to prevent the substrate from being metal-contaminated by the component constituting the furnace opening.

The invention claimed is:

1. A furnace opening structure comprising:
    an upper inlet structure connected to a first protrusion provided at a lower portion of a reaction tube via a first seal, and configured to support the reaction tube;
    a lower inlet structure connected to the upper inlet structure via a second seal; and
    a fixing structure connected to the upper inlet structure and configured to fix the first protrusion,
    wherein the upper inlet structure is provided below an exhaust pipe provided at the lower portion of the reaction tube, and
    wherein the first protrusion is configured to be capable of being cooled by circulating a cooling medium through flow paths provided inside the upper inlet structure and the fixing structure, respectively.

2. The furnace opening structure of claim 1, wherein a second protrusion configured to be capable of covering at least a part of an inner wall of the upper inlet structure is provided at a lower end of the reaction tube.

3. The furnace opening structure of claim 2, wherein the second protrusion is configured to protrude from the lower end of the reaction tube so as to cover the inner wall of the upper inlet structure without being in contact with the lower inlet structure.

4. The furnace opening structure of claim 1, wherein the cooling medium comprises a liquid.

5. The furnace opening structure of claim 1, wherein a heater capable of heating an outer wall of the lower inlet structure is provided at the lower inlet structure.

6. The furnace opening structure of claim 1, wherein the reaction tube is configured such that a thickness of a portion thereof where the exhaust pipe is provided is set to be greater than a thickness of the other portion thereof.

7. The furnace opening structure of claim 1, wherein a lid connected to the lower inlet structure via a third seal is provided, and
    wherein a space surrounded by the reaction tube, the upper inlet structure, the lower inlet structure and the lid is airtightly sealed by the first seal, the second seal and the third seal so as to be capable of being depressurized.

8. The furnace opening structure of claim 1, wherein the flow path provided inside the upper inlet structure is provided below the first protrusion, and the flow path provided inside the fixing structure is provided above the first protrusion.

9. The furnace opening structure of claim 1, wherein the reaction tube is constituted by: an inner tube in which a process chamber where a substrate is processed is provided; and an outer tube provided outside of the inner tube so as to surround the inner tube, and
    wherein the upper inlet structure is configured to support the outer tube and the lower inlet structure is configured to support the inner tube.

10. The furnace opening structure of claim 1, wherein a coating process is performed on an inner wall of the lower inlet structure.

11. A substrate processing apparatus comprising a furnace opening structure, wherein the furnace opening structure comprises:
    an upper inlet structure connected to a first protrusion provided at a lower portion of a reaction tube via a first seal, and configured to support the reaction tube;
    a lower inlet structure connected to the upper inlet structure via a second seal; and
    a fixing structure connected to the upper inlet structure and configured to fix the first protrusion,
    wherein the upper inlet structure is provided below an exhaust pipe provided at the lower portion of the reaction tube, and
    wherein the first protrusion is configured to be capable of being cooled by circulating a cooling medium through flow paths provided inside the upper inlet structure and the fixing structure, respectively.

12. The substrate processing apparatus of claim 11, wherein the reaction tube is constituted by: an inner tube in which a process chamber where a substrate is processed is provided; and an outer tube provided outside of the inner tube so as to surround the inner tube, and
    wherein the upper inlet structure is configured to support the outer tube and the lower inlet structure is configured to support the inner tube.

13. The substrate processing apparatus of claim 11, further comprising
    a heater provided at an outer wall of the lower inlet structure and configured to be capable of heating the outer wall of the lower inlet structure.

14. The substrate processing apparatus of claim 11, further comprising
    a temperature sensor provided at an outer wall of the lower inlet structure and configured to be capable of detecting a temperature set in advance.

15. The substrate processing apparatus of claim 14, further comprising
    a controller configured to be capable of controlling a heater capable of heating the outer wall of the lower inlet structure based on a signal from the temperature sensor when a temperature of the outer wall of the lower inlet structure is lower than the temperature set in advance.

16. The substrate processing apparatus of claim 12, further comprising
    a heating structure provided outside of the outer tube and configured to be capable of heating the process chamber, wherein a pre-set temperature of the heating structure is configured to be capable of being adjusted to a first temperature or higher.

17. The substrate processing apparatus of claim 16, further comprising
a cooling medium supplier configured to individually supply the cooling medium to the upper inlet structure and the fixing structure.

18. The substrate processing apparatus of claim 16, further comprising
a controller configured to be capable of controlling a temperature of each component constituting the furnace opening structure within a predetermined temperature range in accordance with the pre-set temperature of the heating structure by using a heater provided at an outer wall of the lower inlet structure.

19. The substrate processing apparatus of claim 12, further comprising
a heating structure provided outside of the outer tube and configured to be capable of heating the process chamber;
a memory configured to store data indicating a correlation among a pre-set temperature of the heating structure, a temperature of a pre-designated portion of the upper inlet structure and a pre-designated portion of the lower inlet structure; and
a controller configured to be capable of controlling an inlet heater provided at the lower inlet structure in accordance with the pre-set temperature of the heating structure.

20. A method of manufacturing a semiconductor device comprising
processing a substrate arranged in a process chamber provided in a furnace opening structure, wherein the furnace opening structure comprises:
an upper inlet structure connected to a first protrusion provided at a lower portion of a reaction tube via a first seal, and configured to support the reaction tube;
a lower inlet structure connected to the upper inlet structure via a second seal; and
a fixing structure connected to the upper inlet structure and configured to fix the first protrusion,
wherein the upper inlet structure is provided below an exhaust pipe provided at the lower portion of the reaction tube, and
wherein the first protrusion is configured to be capable of being cooled by circulating a cooling medium through flow paths provided inside the upper inlet structure and the fixing structure, respectively.

* * * * *